US007005805B2

(12) United States Patent
Ahn

(10) Patent No.: US 7,005,805 B2
(45) Date of Patent: Feb. 28, 2006

(54) BACK LIGHT CIRCUIT OF LCD IN AN ELECTRIC REFRIGERATOR

(75) Inventor: Woong-Sub Ahn, Changwon (KR)

(73) Assignee: LG Electronics Inc., (KR)

( * ) Notice: Subject to any disclaimer, the term of this patent is extended or adjusted under 35 U.S.C. 154(b) by 57 days.

(21) Appl. No.: 10/478,487

(22) PCT Filed: May 22, 2002

(86) PCT No.: PCT/KR02/00973

§ 371 (c)(1),
(2), (4) Date: Nov. 21, 2003

(87) PCT Pub. No.: WO02/097345

PCT Pub. Date: Dec. 5, 2002

(65) Prior Publication Data

US 2004/0150348 A1 Aug. 5, 2004

(30) Foreign Application Priority Data

May 22, 2001 (KR) .............................. 2001-28027

(51) Int. Cl.
*H05B 39/10* (2006.01)
*H01L 27/14* (2006.01)

(52) U.S. Cl. ........................ 315/88; 315/291; 315/312; 362/800

(58) Field of Classification Search ............ 315/88–92, 315/291, 307, 185 A, 200, 312, 314, 316, 315/324, 185 S, 200 A; 362/13, 20, 800
See application file for complete search history.

(56) References Cited

U.S. PATENT DOCUMENTS

| | | | | |
|---|---|---|---|---|
| 6,268,702 | B1 * | 7/2001 | Fleck | 315/185 R |
| 6,286,976 | B1 * | 9/2001 | Chopra et al. | 362/183 |
| 6,417,624 | B1 * | 7/2002 | Ito et al. | 315/88 |
| 6,476,559 | B1 * | 11/2002 | Rapp | 315/88 |
| 6,498,436 | B1 * | 12/2002 | Hartge et al. | 315/86 |
| 6,567,009 | B1 * | 5/2003 | Ohishi et al. | 340/815.45 |

FOREIGN PATENT DOCUMENTS

| | | |
|---|---|---|
| JP | 8-248383 | 9/1996 |
| JP | 11-223805 | 8/1999 |

OTHER PUBLICATIONS

International Search Report dated Sep. 13, 2002.

* cited by examiner

*Primary Examiner*—Tuyet Thi Vo
(74) *Attorney, Agent, or Firm*—Ostrolenk, Faber, Gerb & Soffen, LLP

(57) ABSTRACT

In an electric freezing refrigerator, when a light emitting diode of back light unit deteriorate due to an external impact or an internal defect or a port terminal of a microcomputer applying power to the light emitting diode is damaged, the back lighting of electric freezing refrigerator can be stably performed by turning another back light unit of the electric freezing refrigerator on.

8 Claims, 2 Drawing Sheets

BACK LIGHT CIRCUIT OF LCD IN AN ELECTRIC REFRIGERATOR

TECHNICAL FIELD

The present invention relates to an LCD back light circuit of an electric refrigerator and, more particularly, to an LCD back light circuit of an electric refrigerator that is capable of stably performing a back lighting even if there is a trouble in a back light circuit caused due to an external impact or an internal defect of a light emitting diode.

BACKGROUND ART

FIG. 1 is a drawing illustrating an LCD back light circuit of an electric refrigerator in accordance with a conventional art.

As shown in FIG. 1, the LCD back light circuit includes a microcomputer 100 for controlling an ON/OFF operation of a circuit and a back light unit 110 connected between a port terminal of a microcomputer and a ground and turned on/off under the control of the microcomputer.

The back light unit 110 includes a light emitting diode group 110-1 in which a plurality of light emitting diodes are serially connected in a forward direction, and a resistance R1 serially connected to the light emitting diode group 110-1 and distributing a power source voltage.

There are provided a plurality of light emitting diode groups which are connected in parallel between the port terminal and the ground.

The operation of the LCD back light circuit of an electric refrigerator in accordance with the conventional art will now be described in detail.

When power is applied to the back light unit 110 through the port terminal of the microcomputer 100, a current of the power source is equally distributed to a plurality of nodes and turns on the light emitting diode groups 110-1, 110-2, . . . , 110-M, and flows to the ground through the resistances R1, R2, . . . , RM. A voltage of the power source is distributed at a certain rate by the light emitting diode groups 110-1, 110-2, . . . , 110-M and the resistances R1, R2, . . . , RM.

However, the LCD back light circuit of an electric refrigerator in accordance with the conventional art has the following problem.

That is, if the port terminal connected to the microcomputer 100 is short, the entire back light unit 110 is turned off.

In addition, if one of light emitting diodes of the LCD back light circuit is defective, the normal light emitting diodes serially connected to the defective light emitting diode are simultaneously turned off, causing a problem that luminance of the LCD is not uniform.

DETAILED DESCRIPTION OF THE INVENTION

Therefore, an object of the present invention is to provide a circuit in which a plurality of port terminals connected to a microcomputer are provided so that, even if one light emitting diode is defective or even if one port terminal connected to a microcomputer becomes short, the light emitting diodes connected to other port terminals can be maintained in an ON state, thereby performing a back light function.

Another object of the present invention is to provide a circuit for performing a back light function in which even if one of serially connected light emitting diodes is defective, light emitting diodes connected to other port terminals are turned on, thereby performing a back light function.

In order to achieve the above objects, there is provided an LCD back light circuit of an electric refrigerator including: a first back light unit operated according to a first control signal; a second back light unit operated according to a second control signal; a detector for generating a power-on signal if no light is detected from the first back light unit, and a microcomputer for generating the first control signal if the power-on signal is not inputted thereto, or generating a second control signal if the power-on signal is inputted thereto.

MODE FOR CARRYING OUT THE PREFERRED EMBODIMENTS

An LCD back light circuit of an electric refrigerator and its driving method in accordance with the present invention will now be described in detail with reference to FIG. 2.

Figure 1:
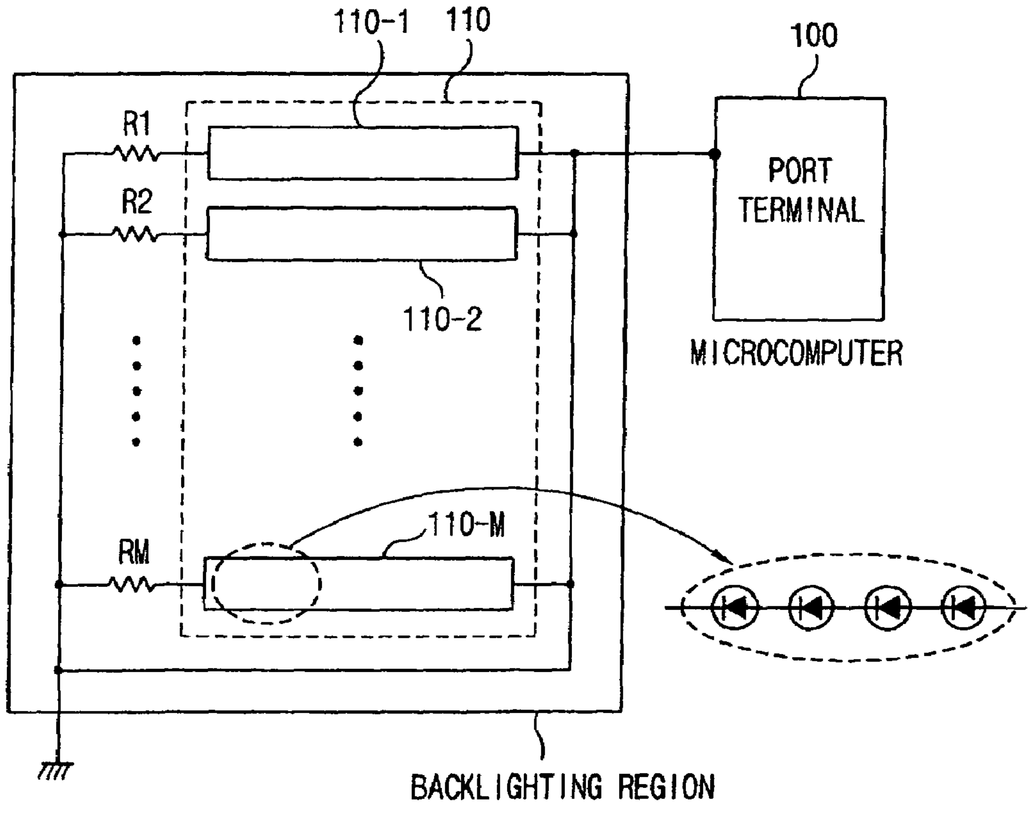
FIG. 1 is a drawing illustrating an LCD back light circuit of an electric refrigerator in accordance with a conventional art.
Figure 2:
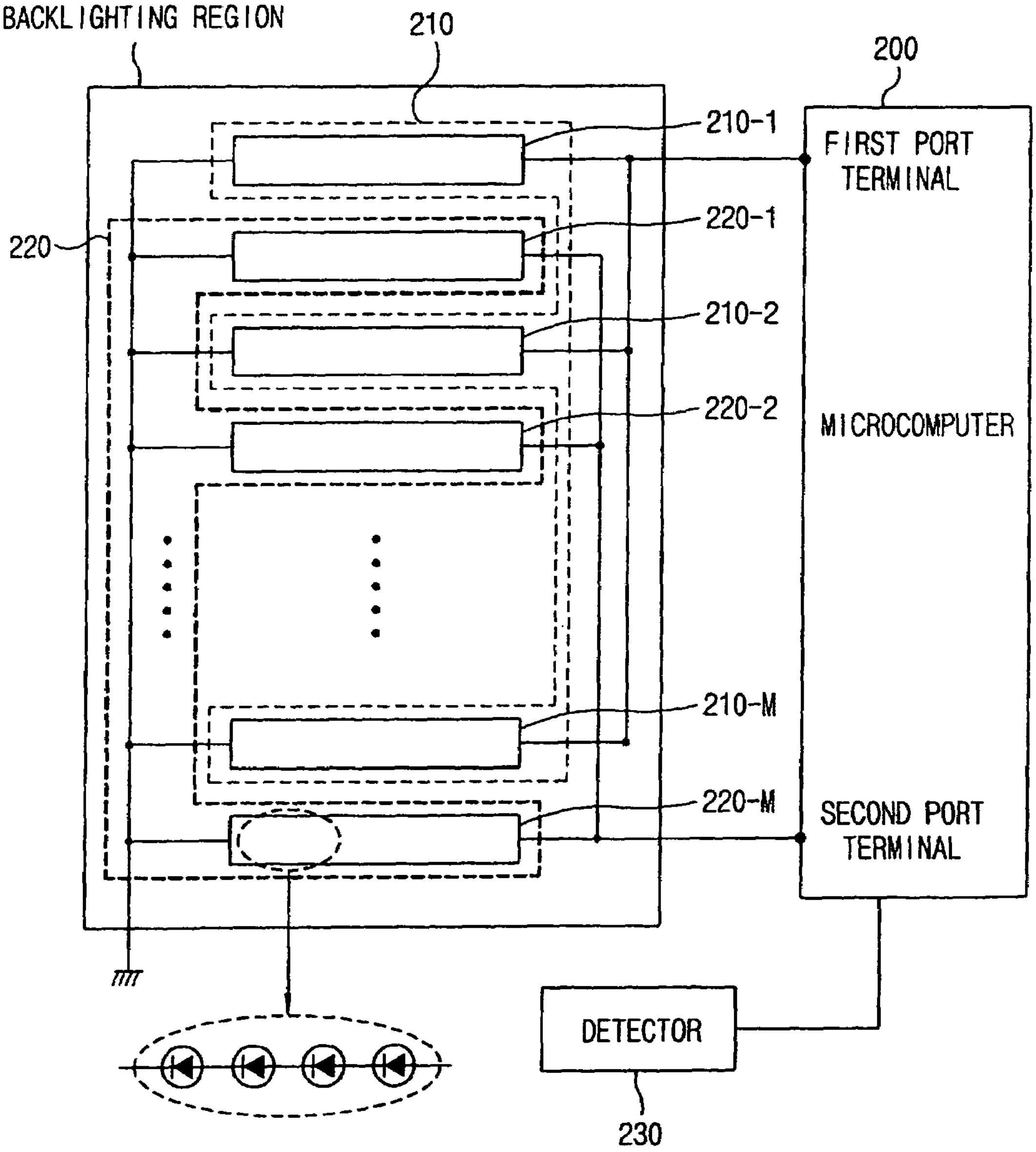
FIG. 2 is a drawing illustrating an LCD back light circuit of an electric refrigerator in accordance with a preferred embodiment of the present invention.

FIG. 2 is a drawing illustrating an LCD back light circuit of an electric refrigerator in accordance with a preferred embodiment of the present invention.

As shown in FIG. 2, the LCD back light circuit includes a microcomputer 200 having a plurality of ports and controlling an ON/OFF operation of the circuit, a first back light unit 210 connected to a first port terminal of the microcomputer and a ground and turned on/off according to a control signal of the microcomputer, a second back light unit 220 connected between a second port terminal of the microcomputer 200 and the ground and turned on/off according to a control signal of the microcomputer, and a detector 230 for detecting whether a light is emitted from the first back light.

In the first back light unit 210, a light emitting diode groups 210-1, 210-2, . . . , 210-M, in which a plurality of light emitting diodes are serially connected, are constructed to be connected in parallel, and in the second back light unit 220, light emitting diode groups 220-1, 220-2, . . . , 220-M, in which a plurality of light emitting diodes are serially connected, are constructed to be connected in parallel.

That is, the light emitting diode groups 220-1, 220-2, . . . , 220-M of the second back light unit 220 are installed at odd numbers of the light emitting diode groups 210-1, 210-2, . . . , 210-M of the first back light unit 210.

The operation of the LCD back light circuit of an electric refrigerator in accordance with a preferred embodiment of the present invention will now be described.

When power is applied to the LCD back light circuit through the first port terminal of the microcomputer 200, a current of the power source is equally distributed to the plurality of nodes to turn the first back light unit 210 and flow to the ground.

However, if the first port becomes short, the first back light unit 210 connected to the first port terminal is turned off. In addition, if one of the first back light units 210 becomes short, a light emitting diode group connected to the light emitting diode which has become short is turned since current fails to flow thereto. Then, the LCD back lighting function can't work properly.

In this respect, however, the detector 230 recognizes that the first back light unit 210 is not working properly and transmits a power-on signal, to the microcomputer 200. Upon receiving the power-on signal, the microcomputer 200 cuts off the power supply current connected to the first port terminal and drive the second back light unit 220 connected to the second port terminal, thereby constantly maintaining the luminance of the LCD back lighting.

INDUSTRIAL APPLICABILITY

As so far described, the LCD back light circuit of an electric refrigerator of the present invention has the following advantages.

That is, if a light emitting diode is defective due to an external impact or an internal defect of the light emitting diode, or if the port terminal of the microcomputer which applies power to the light emitting diode, the light emitting diodes connected to other port terminal of the microcomputer, so that the LCD back light of the electric refrigerator can be stably driven.

In addition, the present invention can be variably changed and implemented in a variety of product groups, not limiting to the electric refrigerator.

What is claimed is:

1. An LCD back light circuit of an electric refrigerator comprising:

a first back light unit operated according to a first control signal;

a second back light unit operated according to a second control signal;

a detector for generating a power-on signal if no light is detected from the first back light unit; and a microcomputer for generating the first control signal if the power-on signal is not inputted thereto, or generating a second control signal if the power-on signal is inputted thereto, wherein the first back light unit includes a plurality of light emitting diode groups which are connected in parallel between a first port terminal and a ground, and the second back light unit includes a plurality of light emitting diode groups which are connected in parallel between a second port terminal and the ground.

2. The circuit of claim 1, wherein the light emitting diode groups of the second back light unit are installed at odd numbers of the light emitting diode groups of the first back light unit.

3. The circuit of claim 1, wherein the light emitting diode groups includes a plurality of light emitting diodes which are connected in series.

4. An LCD back light circuit of an electric refrigerator which controls an operation of a first back light unit connected to a first port terminal of a microcomputer, comprising:

a second back light unit connected to a second port terminal of the microcomputer;

a detector for generating a power-on signal if no light is detected from the first back light unit; and a microcomputer for controlling an operation of the second back light unit upon receipt of the power-on signal, wherein the first back light unit includes a plurality of light emitting diode groups which are connected in parallel between the first port terminal and a ground, and the second back light unit includes a plurality of light emitting diode groups which are connected in parallel between the second port terminal and the ground.

5. The circuit of claim 4, wherein the light emitting diode groups of the second back light unit are installed at odd numbers of the light emitting diode groups of the first back light unit.

6. The circuit of claim 4, wherein, in the light emitting group, a plurality of light emitting diodes are connected in series.

7. An LCD back light circuit of an electric refrigerator comprising:

a plurality of first back light units having a plurality of light emitting diodes;

a plurality of second back light units having a plurality of light emitting diodes and being installed at odd numbers of the first back light units;

a detector for generating a power-on signal if no light is detected from the first back light units; and a microcomputer for turning on the first back light units if the power-on signal is not inputted thereto, or turning on the second back light units if the power-on signal is inputted thereto, wherein the first back light unit includes a plurality of light emitting diode groups connected in parallel between the first port terminal and the ground, and the second back light unit includes a plurality of light emitting diode groups connected in parallel between the second port terminal and the ground.

8. The circuit of claim 7, wherein the light emitting group includes a plurality of light emitting diodes which are connected in series.

* * * * *